(12) United States Patent
Leobandung (10) Patent No.: US 10,249,632 B2
(45) Date of Patent: Apr. 2, 2019

(54) SIMPLE INTEGRATION OF NON-VOLATILE MEMORY AND COMPLEMENTARY METAL OXIDE SEMICONDUCTOR

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/866,077

(22) Filed: Jan. 9, 2018

(65) Prior Publication Data

US 2018/0130811 A1  May 10, 2018

Related U.S. Application Data

(62) Division of application No. 15/331,440, filed on Oct. 21, 2016, now Pat. No. 9,881,930.

(51) Int. Cl.
*H01L 29/66* (2006.01)
*H01L 27/11524* (2017.01)
(Continued)

(52) U.S. Cl.
CPC .. *H01L 27/11524* (2013.01); *H01L 21/28273* (2013.01); *H01L 21/76224* (2013.01);
(Continued)

(58) Field of Classification Search
CPC ......... H01L 27/11524; H01L 21/28273; H01L 21/76224; H01L 29/66825; H01L 29/495;
(Continued)

(56) References Cited

U.S. PATENT DOCUMENTS 6,482,698 B2  11/2002  Peschiaroli et al.
6,627,928 B2   9/2003  Peschiaroli et al.
(Continued)

FOREIGN PATENT DOCUMENTS

CN          1581467 A      2/2005
CN        105390501 A      3/2016
KR    10-2006-0044402 A    5/2006

OTHER PUBLICATIONS

List of IBM Patents or Patent Applications Treated as Related dated Jan. 9, 2018, 2 pages.

*Primary Examiner* — Bitew A Dinke
(74) *Attorney, Agent, or Firm* — Scully, Scott, Murphy & Presser, P.C.; L. Jeffrey Kelly, Esq.

(57) ABSTRACT

A method that allows integrating complementary metal oxide semiconductor (CMOS) transistors and a non-volatile memory (NVM) transistor on a single substrate is provided. The NVM transistor includes a gate stack containing a high-k tunneling gate dielectric, a floating gate electrode, a high-k control gate dielectric and a control gate electrode. The high-k tunneling gate dielectric is formed form a first high-k dielectric layer employed in formation of a gate dielectric for a p-type field effect transistor (FET), the floating gate electrode is formed from a capping material layer employed in annealing the first high-k dielectric layer, and the high-k control gate dielectric is formed from a second high-k dielectric layer employed in formation of a gate dielectric for an n-type FET.

18 Claims, 7 Drawing Sheets

(51) Int. Cl.
*H01L 27/092* (2006.01)
*H01L 29/06* (2006.01)
*H01L 29/423* (2006.01)
*H01L 29/49* (2006.01)
*H01L 21/762* (2006.01)
*H01L 21/28* (2006.01)

(52) U.S. Cl.
CPC ........ *H01L 27/092* (2013.01); *H01L 29/0649* (2013.01); *H01L 29/42324* (2013.01); *H01L 29/495* (2013.01); *H01L 29/4916* (2013.01); *H01L 29/66825* (2013.01)

(58) Field of Classification Search
CPC ........... H01L 29/42324; H01L 29/0649; H01L 27/092; H01L 29/4916; H01L 29/66545
See application file for complete search history.

(56) References Cited

U.S. PATENT DOCUMENTS

| | | |
|---|---|---|
| 6,803,284 B2 | 10/2004 | Hwang |
| 8,399,310 B2 | 3/2013 | Shroff et al. |
| 8,564,044 B2 | 10/2013 | Shroff et al. |
| 2004/0246780 A1 | 12/2004 | Kawahara et al. |
| 2008/0042184 A1 | 2/2008 | Thomas |
| 2008/0105945 A1 | 5/2008 | Steimle et al. |
| 2008/0112231 A1 | 5/2008 | Shum |
| 2008/0308855 A1 | 12/2008 | Ei-Kareh et al. |
| 2009/0108322 A1 | 4/2009 | Widjaja |
| 2009/0190402 A1 | 7/2009 | Hsu et al. |
| 2009/0256211 A1 | 10/2009 | Booth, Jr. et al. |
| 2011/0062507 A1 | 3/2011 | Wu et al. |
| 2013/0020626 A1 | 1/2013 | Tan et al. |
| 2013/0256802 A1* | 10/2013 | Jagannathan ..... H01L 21/28518 257/368 |
| 2013/0299914 A1* | 11/2013 | Kim ...................... H01L 27/092 257/369 |
| 2013/0334584 A1 | 12/2013 | Tang et al. |
| 2014/0264540 A1 | 9/2014 | Tan et al. |
| 2016/0225778 A1 | 8/2016 | Zhang et al. |
| 2016/0276225 A1* | 9/2016 | Kim ................. H01L 27/088 |
| 2018/0082908 A1* | 3/2018 | Yeh ................. H01L 21/823842 |

* cited by examiner

SIMPLE INTEGRATION OF NON-VOLATILE MEMORY AND COMPLEMENTARY METAL OXIDE SEMICONDUCTOR

BACKGROUND

The present application relates to semiconductor device fabrication, and particularly, to the integration of non-volatile memory (NVM) devices and complementary metal oxide semiconductor (CMOS) devices on a single substrate.

NVM devices, such as EEPROM and flash memory, are used in computer and other electronic devices to store date and/or programming instructions that can be electrically erased and re-programmed and that must be saved when power is removed. It is beneficial to integrate NVM devices into a CMOS logic circuitry for high performance CPU, FPGA or neural network. Current advanced logic technology is typically accomplished using a replacement gate (also called gate-last) process flow in which temporary gate material (typically polysilicon) is removed and replaced with a metal gate. Integrating the NVM device with CMOS transistors having the metal gate and the high-k gate dielectric on the same integrated circuit usually requires many additional processing steps. Therefore, a method that allows effectively integrating NVM devices and CMOS devices in a replacement gate process flow is highly desirable.

SUMMARY

The present application provides a feasible integration flow that allows integrating CMOS devices and NVM devices on a same substrate without requiring addition processing steps employed for fabrication of the CMOS devices. By using a gate-last processing flow, a tunneling gate dielectric for NVM transistors is formed at the same time as a gate dielectric for n-type field effect transistors (pFETs), and a control gate dielectric for the NVM transistors is formed at that same time as a gate dielectric for p-type field effect transistors (nFETs).

According to an aspect of the present application, a semiconductor structure is provided. The semiconductor structure includes a first field effect transistor (FET) of a first conductivity type located in a first device region of a substrate, a non-volatile memory (NVM) transistor located in a second device region of the substrate, and a second FET of a second conductivity type that is opposite to the first conductivity type located in a third device region of the substrate. The first FET includes a first gate stack contacting a first channel region of a first semiconductor material portion and including, from bottom to top, a first high-k gate dielectric and a first gate electrode, and first source/drain regions located within the first semiconductor material portion and laterally surrounding the first channel region. The NVM transistor includes a second gate stack contacting a second channel region of a second semiconductor material portion and including, from bottom to top, a high-k tunneling gate dielectric, a floating gate electrode, a high-k control gate dielectric and a control gate electrode, and second source/drain regions located within the second semiconductor material portion and laterally surrounding the second channel region. The second FET includes a third gate stack contacting a third channel region of a third semiconductor material portion and including a second high-k gate dielectric and a second gate electrode, and third source/drain regions located within the third semiconductor material portion and laterally surrounding the third channel region. The first high-k gate dielectric is composed of a high-k dielectric material the same as the high-k tunneling gate dielectric, and the second high-k gate dielectric is composed of a high-k dielectric material the same as the high-k control gate dielectric.

According to another aspect of the present application, a method of forming a semiconductor structure is provided. The method includes providing a structure comprising a first gate cavity exposing a channel region of a first semiconductor material portion located in a first device region of a substrate, a second gate cavity exposing a channel region of a second semiconductor material portion located in a second device region of the substrate, and a third gate cavity exposing a channel region of a third semiconductor material portion located in a third device region of the substrate. The first gate cavity, the second gate cavity and the third gate cavity are laterally surrounded by an interlevel dielectric (ILD) layer. After forming a first high-k dielectric layer along sidewalls and bottom surfaces of the first, the second and the third gate cavities and on a top surface of the ILD layer and forming a capping material layer on the first high-k dielectric layer, the capping material layer and the first high-k dielectric layer are patterned to remove a portion of each of the capping material layer and the first high-k dielectric layer from the third device region. The patterning provides a patterned capping material layer and a patterned first high-k dielectric layer covering the first device region and the second device region, and a portion of the ILD layer and the third gate cavity in the third device region are exposed. Next, a second high-k dielectric layer is formed on the patterned capping material layer, the exposed portion of the ILD layer and along the sidewall and the bottom surface of the third gate cavity. The second high-k dielectric layer and the patterned capping material layer are then patterned to remove a portion of each of the second high-k dielectric layer and the patterned capping material layer from the first device region. The patterning provides a patterned second high-k dielectric layer covering the second device region and the third device region and a capping material portion solely in the second device region, and a portion of the patterned first high-k dielectric layer in the first device region is exposed. Next, a conductive material layer is deposited on the patterned first high-k dielectric layer and the patterned second high-k dielectric layer to completely fill the first, the second and the third gate cavities.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to integration of fin-based CMOS and NVM devices, the basic concept of the present application can also be applied to integration of planar- or nanowire-based CMOS and NVM devices.

Figure 1A:
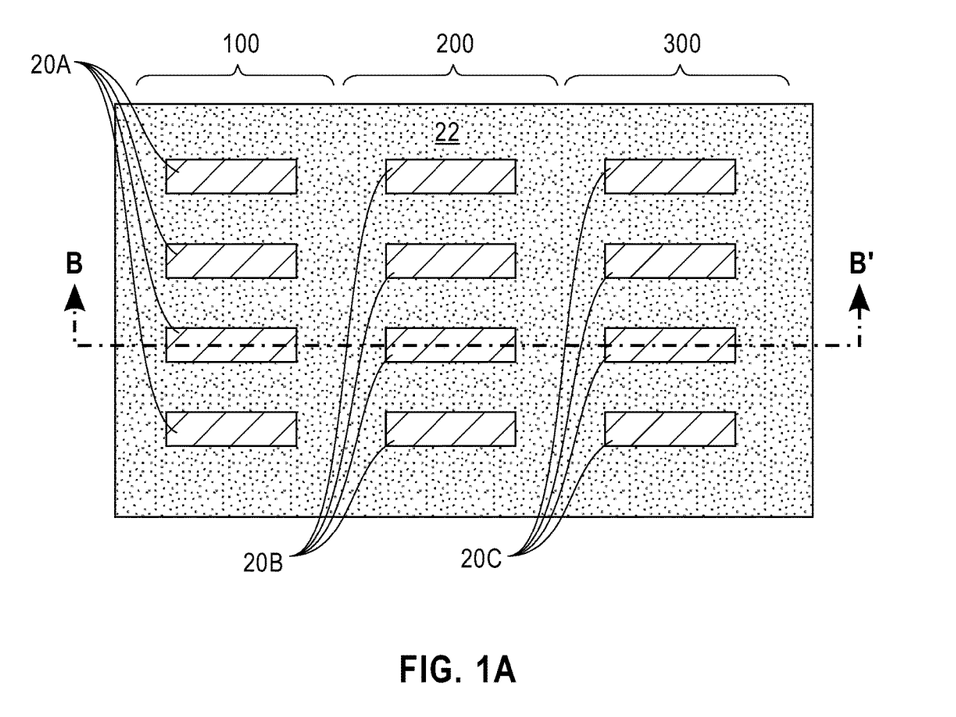
FIG. 1A is a top-down view of an exemplary semiconductor structure including first semiconductor fins, second semiconductor fins and third semiconductor fins located in a first device region, a second device region and a third device region of a substrate, respectively, and a shallow trench isolation (STI) layer formed around lower portions of the first, second and third semiconductor fins according to an embodiment of the present application.
Figure 1B:
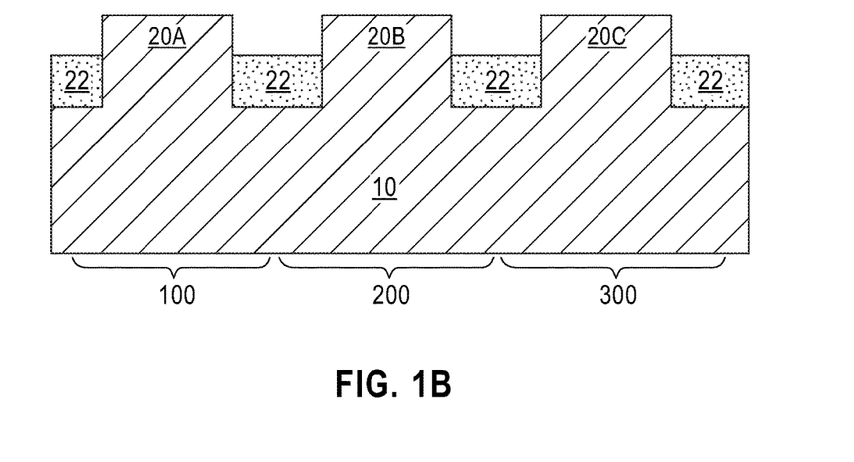
FIG. 1B is a cross-sectional view of the exemplary semiconductor structure of FIG. 1A along line B-B'.

Referring to FIGS. 1A and 1B, an exemplary semiconductor structure according to an embodiment of the present application includes a plurality of first semiconductor material portions formed in a first device region 100 of a substrate 10, a plurality of second semiconductor material portions formed in a second device region 200 of the substrate 10, and a plurality of third semiconductor material portions formed in a third device region 300 of the substrate 10. In one embodiment, the first device region 100 can be a p-type FET (pFET) region, the second device region 200 can be an NVM region, and the third device region 300 can be an n-type FET (nFET) region.

In some embodiments, and as illustrated in the drawings of the present application, the semiconductor material portions are semiconductor fins (hereafter referred to as first semiconductor fins 20A, second semiconductor fins 20B, and third semiconductor fins 20C). In other embodiments (not shown), the semiconductor material portions are planar active semiconductor regions for forming planar CMOS and NVM devices.

In one embodiment and as shown in FIG. 1B, the semiconductor fins 20A, 20B, 20C can be formed by providing a bulk semiconductor substrate including a semiconductor material throughout, and by patterning an upper portion of the bulk semiconductor substrate. In this case, the remaining portion of the bulk semiconductor substrate underlying the semiconductor fins 20A, 20B, 20C constitutes the substrate 10. The semiconductor fins 20A, 20B, 20C are adjoined to the substrate 10 and are composed of the same semiconductor material as the upper portion of the bulk semiconductor substrate.

The bulk semiconductor substrate may include a semiconductor material such as, for example, Si, Ge, SiGe, SiC, SiGeC or an III-V compound semiconductor. In one embodiment, the bulk semiconductor substrate includes a single crystalline semiconductor material such as, for example, single crystalline silicon. The thickness of the bulk semiconductor substrate can be from 30 μm to about 2 mm, although lesser and greater thicknesses can also be employed. The bulk semiconductor substrate may be doped with dopants of p-type or n-type. In one embodiment, the dopants may be a p-type dopant including, but not limited to, boron (B), aluminum (Al), gallium (Ga), and indium (In) for Si based substrate. In another embodiment, the dopants may be an n-type dopant including, but not limited to, antimony (Sb), arsenic (As), and phosphorous (P) for Si based substrate. The dopant concentration in the bulk semiconductor substrate can range from $1\times10^{14}$ atoms/cm$^3$ to $3\times10^{17}$ atoms/cm$^3$, although lesser and greater dopant concentrations can also be employed.

In one embodiment, the upper portion of the bulk semiconductor substrate can be patterned using lithography and etching to provide the semiconductor fins 20A, 20B, 20C extending upwards from the substrate 10. For example, a mask layer (not shown) can be applied over a top surface of the bulk semiconductor substrate and lithographically patterned to define a set of areas covered by a patterned mask layer. The mask layer can be a photoresist layer or a photoresist layer in conjunction with a hardmask layer(s). The bulk semiconductor substrate is then etched by an anisotropic etch using the patterned mask layer as an etch mask. In one embodiment, a dry etch such as, for example, reactive ion etch (RIE) can be used. In another embodiment, a wet etch using a chemical etchant can be used. In still a further embodiment, a combination of dry etch and wet etch can be used. After formation of the semiconductor fins 20A, 20B, 20C, the patterned mask layer can be removed, for example, by oxygen plasma. Other methods known in the art, such as sidewall image transfer (SIT) or directional self-assembly (DSA), can also be used to pattern the upper portion of the bulk semiconductor substrate to provide the semiconductor fins 20A, 20B, 20C.

In another embodiment, the semiconductor fins 20A, 20B, 20C can be formed by providing a semiconductor-on-insulator (SOI) substrate including a top semiconductor layer, a buried insulator layer, and a handle substrate, and by patterning the top semiconductor layer (not shown). In this case, the remaining portions of the top semiconductor layer after patterning constitute the semiconductor fins 20A, 20B, 20C and the buried insulator layer constitutes the substrate 10.

Subsequently, a shallow trench isolation (STI) layer 22 can be formed around lower portions of the semiconductor fins 20A, 20B, 20C; in some embodiments, the STI layer 22 can be omitted. As is shown, the height of the STI layer 22 is less than the height of each of the semiconductor fins 20A, 20B, 20C such that upper sidewalls and a topmost surface of each of the semiconductor fins 20A, 20B, 20C are exposed. The height of the portion of each of the semiconductor fins 20A, 20B, 20C located above the top surface of the STI layer 22 (or above the buried insulator layer if the semiconductor fins are formed from an SOI substrate) can be from 10 nm to 200 nm, although lesser and greater heights can also be employed.

The STI layer 22 can be formed by first depositing a trench dielectric material such as, a trench dielectric oxide, over and between the semiconductor fins 20A and 20B, 20C using a deposition process, such as, for example, chemical vapor deposition (CVD) or physical vapor deposition (PVD). In one embodiment, the trench dielectric oxide is silicon dioxide. The deposited trench dielectric material can then be planarized by a planarization technique such as, for example, chemical mechanical planarization (CMP) followed by an etched back process to etch the deposited trench dielectric material to the desired thickness. An anisotropic etch such as, for example, RIE may be employed to remove the trench dielectric material of the STI layer 22 selective to the semiconductor material of the semiconductor fins 20A, 20B.

Figure 2:
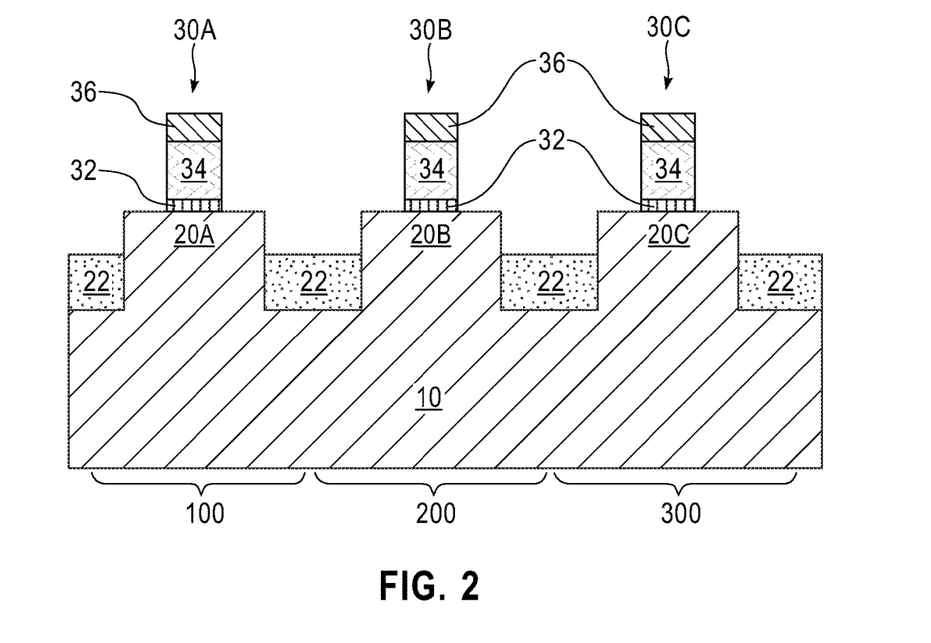
FIG. 2 is a cross-sectional view of the exemplary semiconductor structure of FIGS. 1A-1B after forming a first sacrificial gate stack straddling a portion of each first semiconductor fin, a second sacrificial gate stack straddling a portion of each second semiconductor fin, and a third sacrificial gate stack straddling a portion of each third semiconductor fin.

Referring to FIG. 2, sacrificial gate stacks including a first sacrificial gate stack 30A straddling a portion of each of the first semiconductor fins 20A in the first device region 100, a second sacrificial gate stack 30B straddling a portion of each of the second semiconductor fins 20B in the second device region 200 and a third sacrificial gate stack 30B straddling a portion of each of the third semiconductor fins 20C in the third device region 300 are formed. By "straddling" it is meant that the sacrificial gate stack formed in each device region is in direct contact with a top surface and two vertical sidewalls of each semiconductor fin. The term "sacrificial gate stack" as used herein refers to a placeholder structure for a functional gate stack to be subsequently formed. The term "functional gate stack" as used herein refers to a permanent gate stack used to control output current (i.e., flow of carriers in the channel) of a semiconducting device through electrical fields or magnetic fields. It should be noted that although a single sacrificial gate stack is described and illustrated in each device region 100, 200, 300, the present application can also be employed when multiple sacrificial gate stacks are formed in each device region 100, 200, 300.

Each of the sacrificial gate stacks 30A, 30B, 30C can include, from bottom to top, a sacrificial gate dielectric 32, a sacrificial gate conductor 34 and a sacrificial gate cap 36. The sacrificial gate stacks 30A, 30B, 30C can be formed by first providing a sacrificial material stack (not shown) that includes, from bottom to top, a sacrificial gate dielectric layer, a sacrificial gate conductor layer and a sacrificial gate cap layer over the semiconductor fins 20A, 20B, 20C and the STI layer 22, and by subsequently patterning the sacrificial material stack.

The sacrificial gate dielectric layer can include silicon oxide, silicon nitride, or silicon oxynitride. The sacrificial gate dielectric layer can be formed utilizing a conventional deposition process such as, for example, CVD or PVD. The sacrificial gate dielectric layer can also be formed by conversion of a surface portion of the semiconductor fins 20A, 20B, 20C utilizing thermal oxidation or nitridation. The thickness of the sacrificial gate dielectric layer can be from 1 nm to 10 nm, although lesser and greater thicknesses can also be employed. In some embodiments of the present application, the sacrificial gate dielectric layer can be omitted.

The sacrificial gate conductor layer can include a semiconductor material such as polysilicon or a silicon-containing semiconductor alloy such as a silicon-germanium alloy. The sacrificial gate conductor layer can be formed utilizing a conventional deposition process such as, for example, CVD or PECVD. The thickness of the sacrificial gate conductor layer can be from 20 nm to 300 nm, although lesser and greater thicknesses can also be employed.

The sacrificial gate cap layer can include a dielectric material such as an oxide, a nitride or an oxynitride. In one embodiment, the sacrificial gate cap layer is composed of silicon nitride. The sacrificial gate cap layer can be formed utilizing a conventional deposition process such as, for example, CVD or PECVD. The sacrificial gate cap layer that is formed may have a thickness from 10 nm to 200 nm, although lesser and greater thicknesses can also be employed.

The sacrificial material stack can be patterned by lithography and etching. For example, a photoresist layer (not shown) may be applied over the topmost surface of the sacrificial material stack and lithographically patterned by lithographic exposure and development . The pattern in the photoresist layer is sequentially transferred into the sacrificial material stack by at least one anisotropic etch. The anisotropic etch can be a dry etch such as, for example, RIE, a wet etch or a combination thereof. A remaining portion of the sacrificial material stack overlying the first semiconductor fins 20A in the first device region 100 constitutes the first sacrificial gate stack 30A, a remaining portion of the sacrificial material stack overlying the second semiconductor fins 20B in the second device region 200 constitutes the second sacrificial gate stack 30B and a remaining portion of the sacrificial material sack overlying the third semiconductor fins 20C in the third device region 300 constitutes the second sacrificial gate stack 30C. The remaining photoresist layer can be subsequently removed by, for example, ashing.

Figure 3:
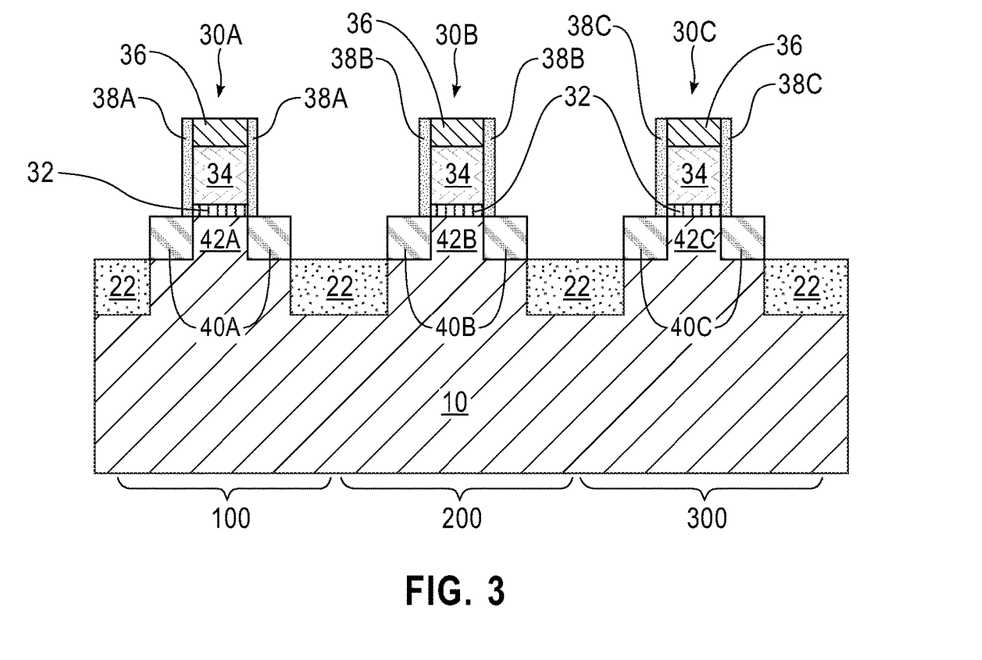
FIG. 3 is a cross-sectional view of the exemplary semiconductor structure of FIG. 2 after forming a first gate spacer, a second gate spacer and a third gate spacer on sidewalls of the first sacrificial gate stack, the second sacrificial gate stack and the third sacrificial gate stack, respective, and forming first source/drain regions in the first semiconductor fins, second source/drain regions in the second semiconductor fins and third source/drain regions in the third semiconductor fins.

Referring to FIG. 3, gate spacers including a first gate spacer 38A present on sidewalls of the first sacrificial gate stack 30A, a second gate spacer 38B present on sidewalls of the second sacrificial gate stack 30B and a third gate spacer 38C present on sidewalls of the third sacrificial gate stack 30B are formed. The gate spacers 38A, 38B, 38C can include a dielectric material such as, for example, an oxide, a nitride, an oxynitride, or any combination thereof. In one embodiment, each of gate spacers 38A, 38B, 38C is composed of silicon nitride. The gate spacers 38A, 38B, 38C can be formed by first providing a conformal gate spacer material layer (not shown) on exposed surfaces of the sacrificial gate stacks 30A, 30B, 30C, the semiconductor fins 20A, 20B, 20C and the STI layer 22 and then etching the gate spacer material layer to remove horizontal portions of the gate spacer material layer. The gate spacer material layer can be provided by a deposition process including, for example, CVD, PECVD or atomic layer deposition (ALD). The etching of the gate spacer material layer may be performed by a dry etch process such as, for example, RIE. A remaining vertical portion of the gate spacer material layer that is present on the sidewalls of the first sacrificial gate stack 30A constitutes the first gate spacer 38A, a remaining vertical portion of the gate spacer material layer that is present on the sidewalls of the second sacrificial gate stack 30B constitutes the second gate spacer 38B,and a remaining vertical portion of the gate spacer material layer that is present on the sidewalls of the third sacrificial gate stack 30C constitutes the third gate spacer 38C. The width of each of the gate spacers 38A, 38B, 38C, as measured at the base, can be from 5 nm to 100 nm, although lesser and greater widths can also be employed.

A first source region and a first drain region (collectively referred to as first source/drain regions 40A) are formed within regions of the first semiconductor fins 20A that do not underlie the first sacrificial gate stack 30A, a second source region and a second drain region (collectively referred to as second source/drain regions 40B) are formed within regions of the second semiconductor fins 20B that do not underlie the second sacrificial gate stack 30B, and a third source region and a third drain region (collectively referred to as third source/drain regions 40C) are formed within regions of the third semiconductor fins 20C that do not underlie the third sacrificial gate stack 30C. The first source/drain regions 40A can include p-type dopants for pFETs, the third source/drain regions 40C can include n-type dopants for nFETs, and the second source/drain regions 40B for NVM transistors can include either p-type dopants the same as the first source/drain regions 40A or n-type dopants the same as the third source/drain regions 40C.

In one embodiment, ion implantation of electrical dopants (i.e., p-type or n-type dopants) can be performed to provide the first source/drain regions 40A, the second source/drain regions 40B and the third source/drain regions 40C. In one embodiment, p-type dopants can be implanted into portions of the first semiconductor fins 20A that are not covered by the first sacrificial gate stack 30A and portions of the second semiconductor fins 20B that are not covered by the second sacrificial gate stack 30B, while masking the third device region 300. Similarly, n-type dopants can be implanted into portions of the third semiconductor fins 20C that are not covered by the third sacrificial gate stack 30C, while masking the first and second device regions 100, 300. In another embodiment, p-type dopants can be implanted into portions of the first semiconductor fins 20A that are not covered by the first sacrificial gate stack 30A, while masking the second and third device regions 200, 300. Similarly, n-type dopants can be implanted into portions of the second semiconductor fins 20B that are not covered by the second sacrificial gate stack 30B and portions of the third semiconductor fins 20C that are not covered by the third sacrificial gate stack 30C, while masking the first device regions 100, 300. The unimplanted portion of each first semiconductor fin 20A is herein referred to as a first channel region 42A, the unimplanted portion of each second semiconductor fin 20B is herein referred to as a second channel region 42B, and the unimplanted portion of each third semiconductor fin 20C is herein referred to as a third channel region 42C.

Alternatively or additionally, the first, second and third source/drain regions 40A, 40B, 40C can be formed by deposition of doped semiconductor materials on the top surfaces and sidewalls of the first, second and third semiconductor fins 20C using selective epitaxy, and by diffusing the electrical dopants in the doped semiconductor materials into the semiconductor fins 20A, 20B, 20C.

Figure 4:
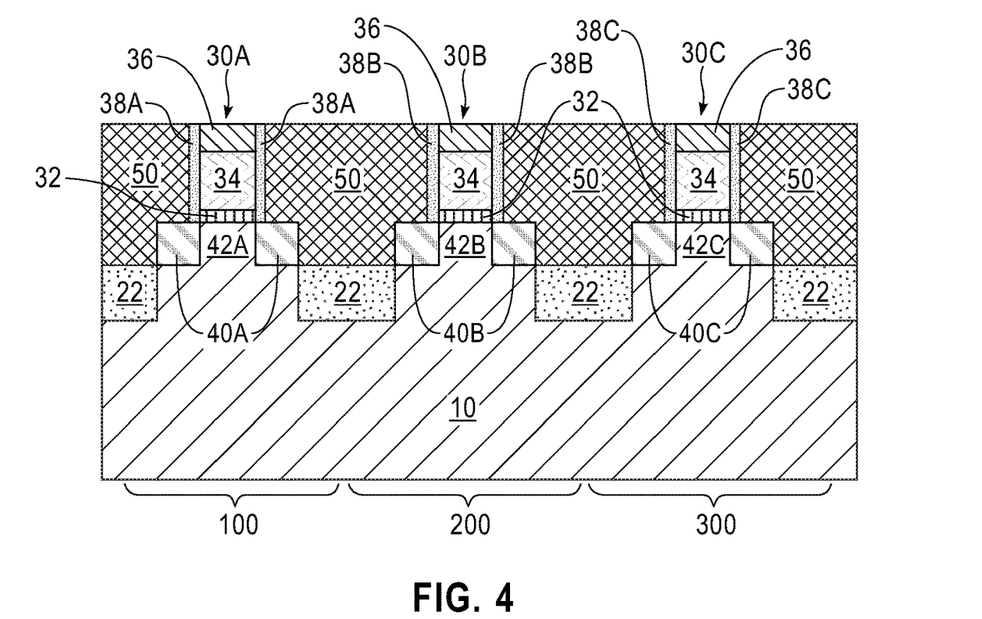
FIG. 4 is a cross-sectional view of the exemplary semiconductor structure of FIG. 3 after forming an interlevel dielectric (ILD) layer.

Referring to FIG. 4, an interlevel dielectric (ILD) layer 50 is formed over the source/drain regions 42A, 42B, 42C and the STI layer 22. The ILD layer 50 laterally surrounds the sacrificial gate stacks 30A, 30B, 30C. The ILD layer 50 may include a dielectric material that can be easily planarized. For example, the ILD layer 50 can be a doped silicate glass, an undoped silicate glass (silicon oxide), an organosilicate glass (OSG), or a porous dielectric material. The ILD layer 50 can be formed by CVD, PVD or spin coating. The ILD layer 50 can be initially formed such that an entirety of the top surface of the ILD layer 50 is formed above the topmost surfaces of the sacrificial gate stacks 30A, 30B, 30C (i.e., top surfaces of the sacrificial gate caps 36). The ILD layer 50 can be subsequently planarized, for example, by CMP and/or a recess etch using the sacrificial gate caps 36 as a polishing and/or an etch stop. After the planarization, the ILD layer 50 has a top surface coplanar with the top surfaces of the sacrificial gate caps 36.

Figure 5:
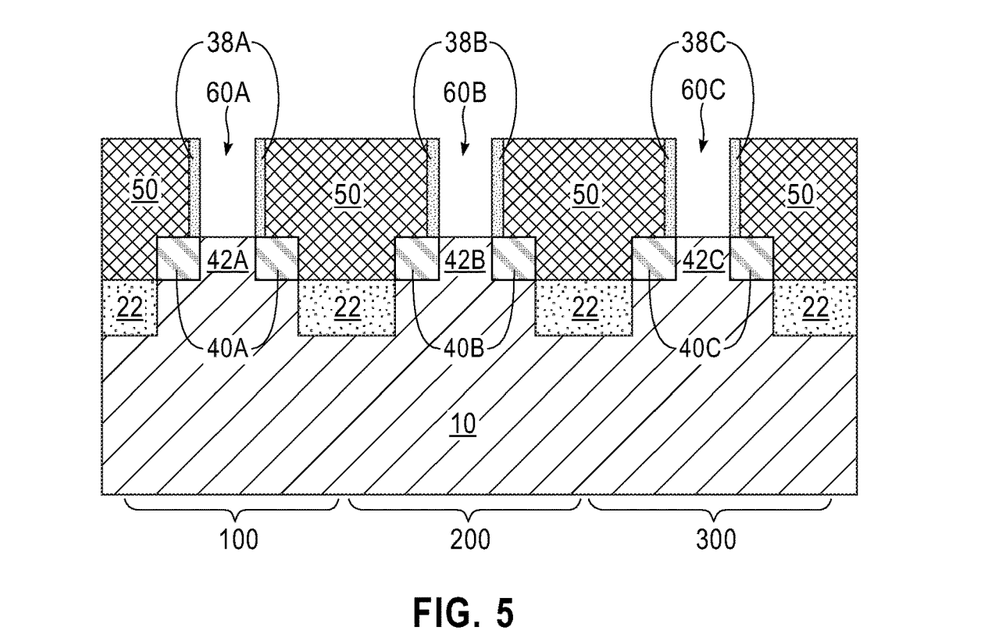
FIG. 5 is a cross-sectional view of the exemplary semiconductor structure of FIG. 4 after removing the first sacrificial gate stack, the second sacrificial gate stack and the third sacrificial gate stack to provide a first gate cavity, a second gate cavity and a third gate cavity, respectively.

Referring to FIG. 5, the first, second and third sacrificial gate stacks 30A, 30B, 30C are removed to provide a first gate cavity 60A, a second gate cavity 60B and a third gate cavity 60C respectively. The removal of the sacrificial gate stacks 30A, 30B, 30C can be achieved by etching. In one embedment, a RIE process can be used to remove the sacrificial gate stacks 30A, 30B, 30C. The first gate cavity 60A occupies a volume from which the first sacrificial gate stack 30A is removed, thus exposing each first channel region 42A. The second gate cavity 60B occupies a volume from which the second sacrificial gate stack 30B is removed, thus exposing each second channel region 42B. The third gate cavity 60C occupies a volume from which the third sacrificial gate stack 30C is removed, thus exposing each third channel region 42C.

Figure 6:
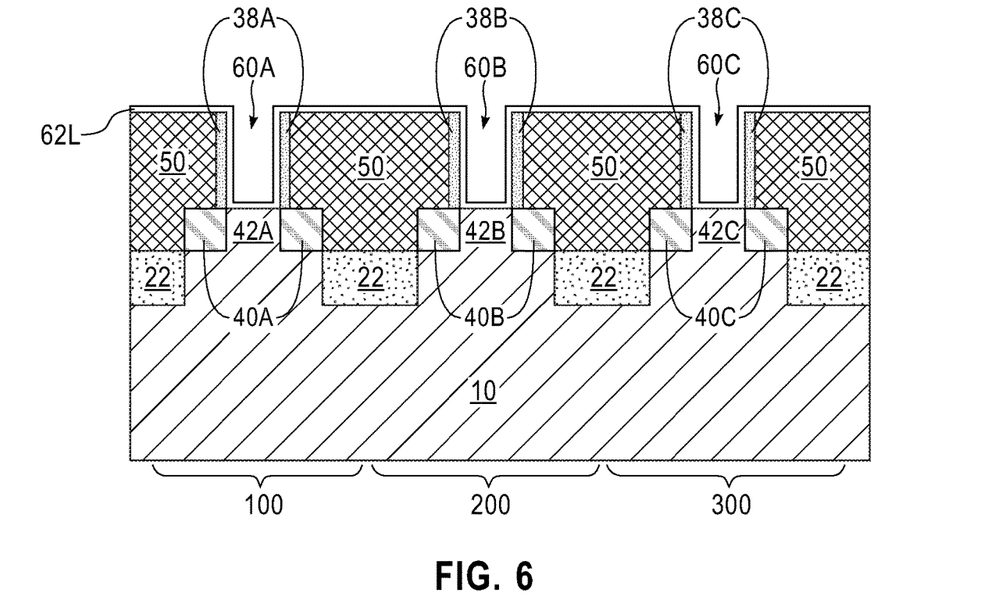
FIG. 6 is a cross-sectional view of the exemplary semiconductor structure of FIG. 5 after forming a first high-k dielectric layer on the bottom surfaces and sidewalls of the first, second and third gate cavities, on the gate spacers and the top surface of the ILD layer.

Referring to FIG. 6, a conformal first high-k dielectric layer 62L is deposited on the bottom surfaces and sidewalls of the gate cavities 60A, 60B, 60C and exposed surfaces of the gate spacers 38A, 38B, 38C and the top surface of the ILD layer 50. As used herein, the term "high-k" means a material having a dielectric constant that is greater than 8.0. In one embodiment, the first high-k dielectric layer 62L includes a metal oxide such as, for example, $HfO_2$, $ZrO_2$, $La_2O_3$, $Al_2O_3$, $TlO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, or an alloy thereof. Each value of x is independently from 0.5 to 3 and each value of y is independently from 0 to 2. In one embodiment, the first high-k dielectric layer 62L includes $HfO_2$. The first high-k dielectric layer 62L can be formed by a conventional deposition process, including but not limited to, CVD, PVD and ALD. The thickness of the first high-k dielectric layer 62L can be from 1 nm to 10 nm, although lesser and greater thicknesses can also be employed.

Figure 7:
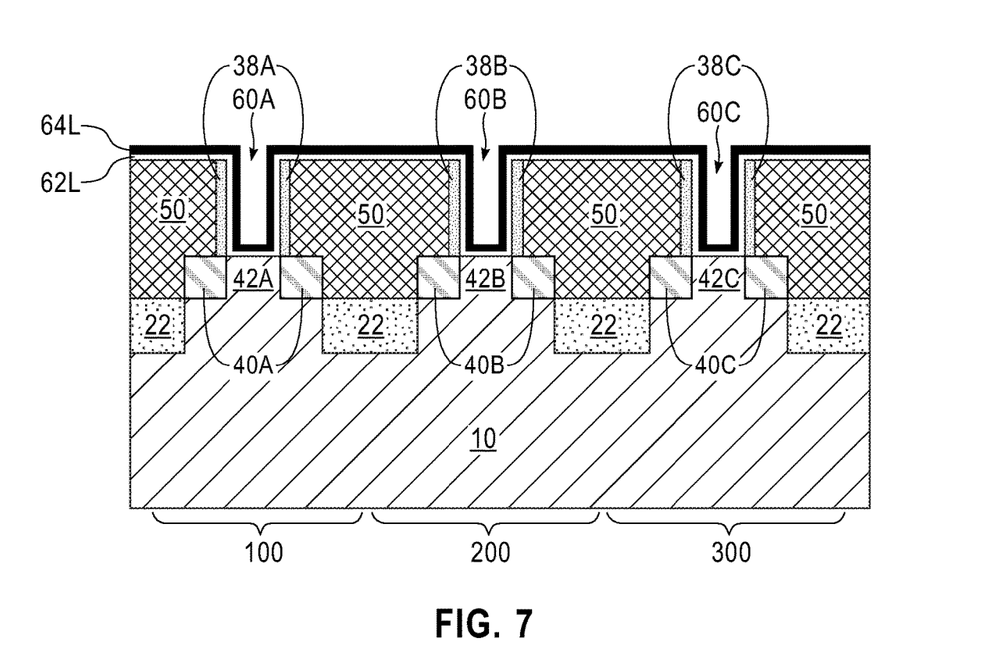
FIG. 7 is a cross-sectional view of the exemplary semiconductor structure of FIG. 6 after forming a capping material layer on the first high-k dielectric layer.

Referring to FIG. 7, a conformal capping material layer 64L is deposited on the first high-k dielectric layer 62L. The capping material layer 64L may include a semiconductor material such as, for example, amorphous silicon or polysilicon. The capping material layer 64L can be deposited on the first high-k dielectric layer 64L using a conventional deposition process such as, for example, CVD or ALD. The thickness of the capping material layer 64L can be from 10 nm to 50 nm, although lesser or greater thicknesses can also be employed.

An anneal is then performed to improve the reliability of the high-k material. The anneal may be carried out in an ambient atmosphere containing $N_2$ at a temperature ranging from 600° C. to 1100 ° C. The anneal may be a rapid thermal anneal (RTA) or a millisecond anneal, such as a laser anneal or flash lamp anneal.

Figure 8:
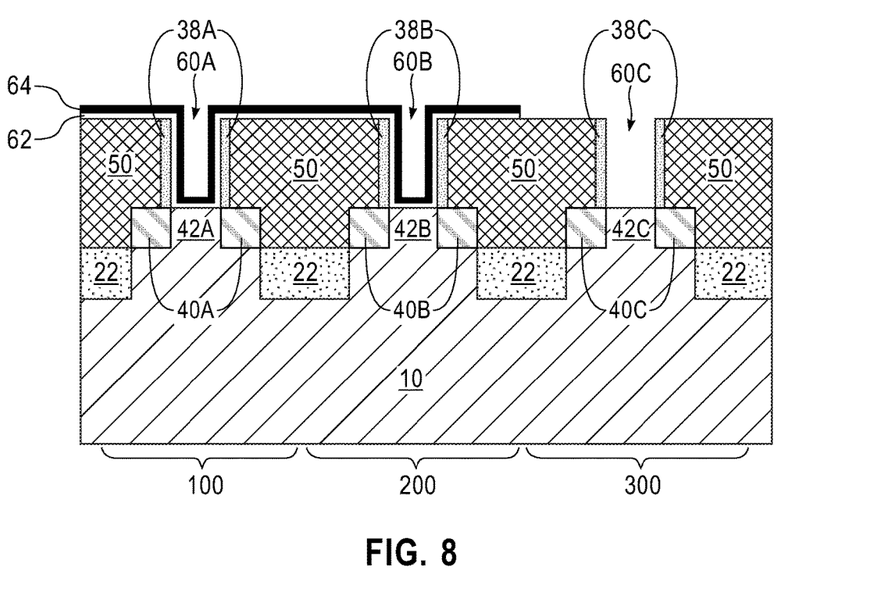
FIG. 8 is a cross-sectional view of the exemplary semiconductor structure of FIG. 7 after removing the capping material layer and the first high-k dielectric from the third device region to providing a patterned first high-k dielectric layer and a patterned capping material layer covering the first and second device regions and to re-expose the sidewalls and the bottom of the third gate cavity.

Referring to FIG. 8, the capping material layer 64L and the first high-k dielectric layer 62L are removed from the third device region 300. A mask layer (not shown) is applied over the capping material layer 64L and lithographically patterned to provide a patterned mask layer (not shown) covering the first and second device regions 100, 200, while exposing the third device region 300. The mask layer can be a photoresist layer or a photoresist layer in conjunction with a hardmask layer(s). The exposed portions of the capping material layer 64L and the first high-k dielectric layer 62L in the third device region 300 are then removed by an etch, which can be a wet chemical etch or a dry etch. In one embodiment, the removal of the capping material layer 64L and the first high-k dielectric layer 62L can be accomplished in a single step by sequentially etching the capping material layer 64L and the first high-k dielectric 62L. The removal of the capping material layer 64L and the first high-k dielectric layer 62 from the third device region 300 re-exposes the third channel region 42C and inner sidewalls of the third gate spacer 38C in the third gate cavity 60C. After etching, the patterned mask layer is removed, for example, by oxygen-based plasma etching. A portion of the capping material layer 64L that remains in the first and second device regions 100, 200 is herein referred to as a patterned capping material layer 64, while a portion of the first high-k dielectric layer 62L that remains in the first and second device regions 100, 200 is herein referred to as a patterned first high-k dielectric layer 62.

Figure 9:
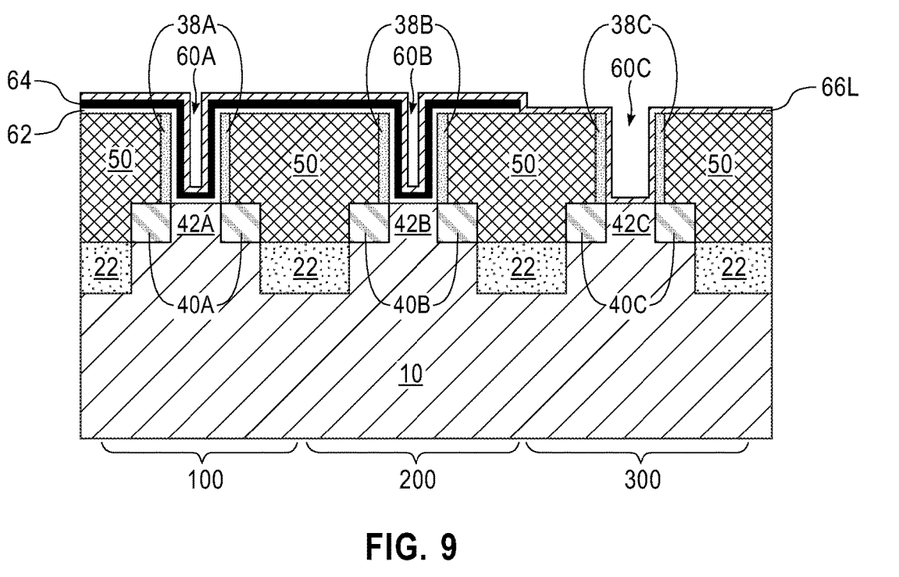
FIG. 9 is a cross-sectional view of the exemplary semiconductor structure of FIG. 8 after forming a second high-k dielectric layer on the patterned capping material layer, the sidewalls and the bottom surface of the third gate cavity and the ILD layer.

Referring to FIG. 9, a conformal second high-k dielectric layer 66L is deposited on the patterned capping material layer 64 and the ILD layer 50 and along the sidewalls and bottom surface of the third gate cavity 60C. The second high-k dielectric layer 66L may include a high-k k dielectric material that is the same as, or different from, the high-k dielectric material that provides the first high-k dielectric layer 62L. For example, the second high-k dielectric layer 66L may include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, or an alloy thereof. Each value of x is independently from 0.5 to 3 and each value of y is independently from 0 to 2. The second high-k dielectric layer 66L can be formed, for example, by CVD, PVD or ALD. The thickness of the second high-k dielectric layer 66L can be from 1 nm to 10 nm, although lesser and greater thicknesses can also be employed.

Following the formation of the second high-k dielectric layer 66L, an optional sacrificial capping material layer (not shown) may be formed on the second high-k dielectric layer 66L. The sacrificial capping material layer may include a semiconductor material the same as, or different from the capping material layer 66L. In one embodiment, the sacrificial capping material layer includes amorphous silicon. An anneal at an elevated temperature is subsequently performed to improve the reliability of the second high-k dielectric layer 66L. After annealing, the sacrificial capping material layer is removed selective to the second high-k dielectric layer 66L. The sacrificial capping material layer can be removed by a dry etch such as, for example, RIE or a wet etch. The removal of the sacrificial capping material layer re-exposes the second high-k dielectric layer 66L.

Figure 10:
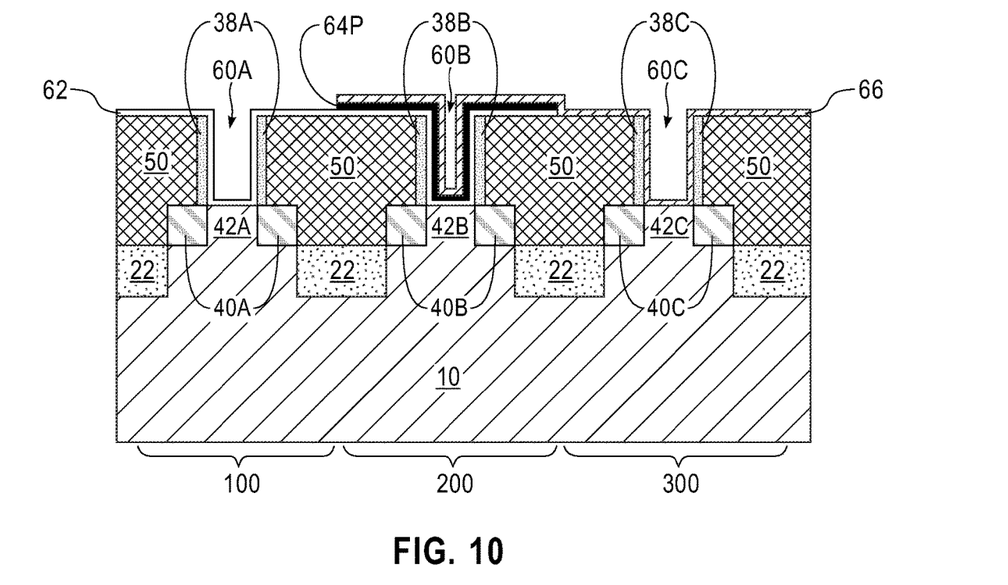
FIG. 10 is a cross-sectional view of the exemplary semiconductor structure of FIG. 9 after removing the second high-k dielectric layer and the patterned capping material layer from the first device region to provide a patterned second high-k dielectric layer covering the second and third device regions and to expose a portion of the patterned first high-k dielectric layer located in the first device region.

Referring to FIG. 10, the second high-k dielectric layer 66L and the patterned capping material layer 64 are removed from the first device region 100, thus re-exposing a portion of the patterned first high-k dielectric layer 62 located within the first gate cavity 60A. A mask layer (not shown) is applied over the second high-k dielectric layer 66L and lithographically patterned to provide a patterned mask layer (not shown) covering the second and third device regions 200, 300, while exposing the first device region 100. The mask layer can be a photoresist layer or a photoresist layer in conjunction with a hardmask layer(s). The exposed portions of the second high-k dielectric layer 66L and the patterned capping material layer 64 in the first device region 100 are then removed by an etch, which can be a wet chemical etch or a dry etch. In one embodiment, the removal of the second high-k dielectric layer 66L and the patterned capping material layer 64 can be accomplished in a single step by sequentially etching the second high-k dielectric layer 66L and the patterned capping material layer 64. After etching, the patterned mask layer can be removed, for example, by oxygen-based plasma etching. A portion of the second high-k layer 66L that remains in the second and third device regions 200, 300 is herein referred to as a patterned second high-k dielectric layer 66, while a portion of the patterned capping material layer 64 that remains only in the second device region 200 is herein referred to as a capping material portion 64P.

Figure 11:
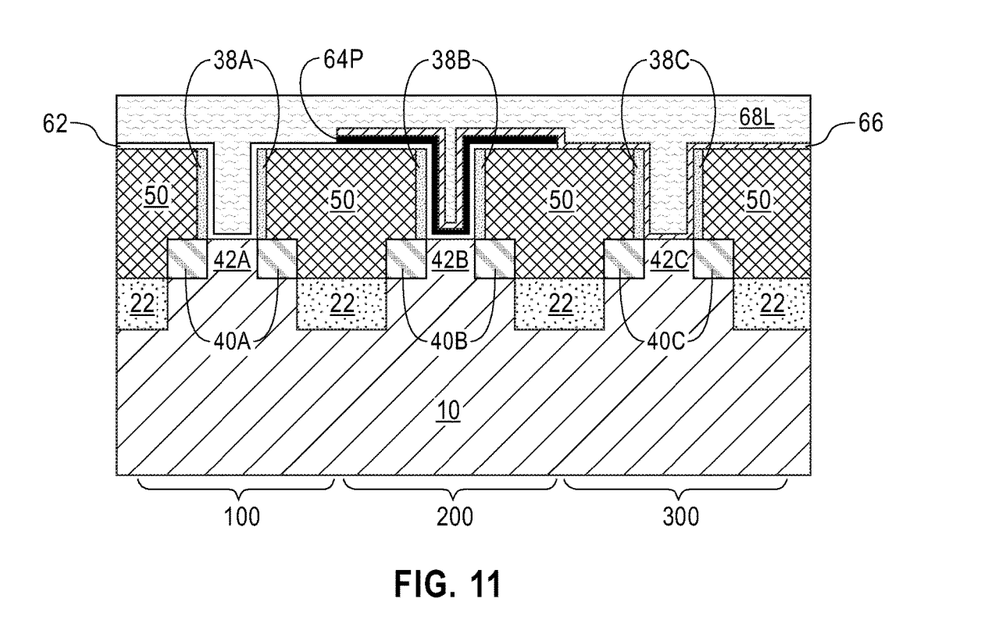
FIG. 11 is a cross-sectional view of the exemplary semiconductor structure of FIG. 10 after forming a conductive material layer on the patterned first high-k dielectric layer and the patterned second high-k dielectric layer to completely fill the first, second and third gate cavities.

Referring to FIG. 11, a conductive material layer 68L is deposited on the patterned first high-k dielectric layer 62 and the patterned second high-k dielectric layer 66 to completely fill the gate cavities 60A, 60B, 60C. The conductive material layer 68L can include a conductive metal such as, for example, Al, Au, Ag, Cu, Co or W. The conductive material layer 68L can be formed by CVD, PVD or ALD. The thickness of the conductive material layer, 68L, as measured in a planar region of the conductive material layer 68L above the top surface of the ILD layer 50, can be from 100 nm to 500 nm, although lesser and greater thicknesses can also be employed.

Figure 12:
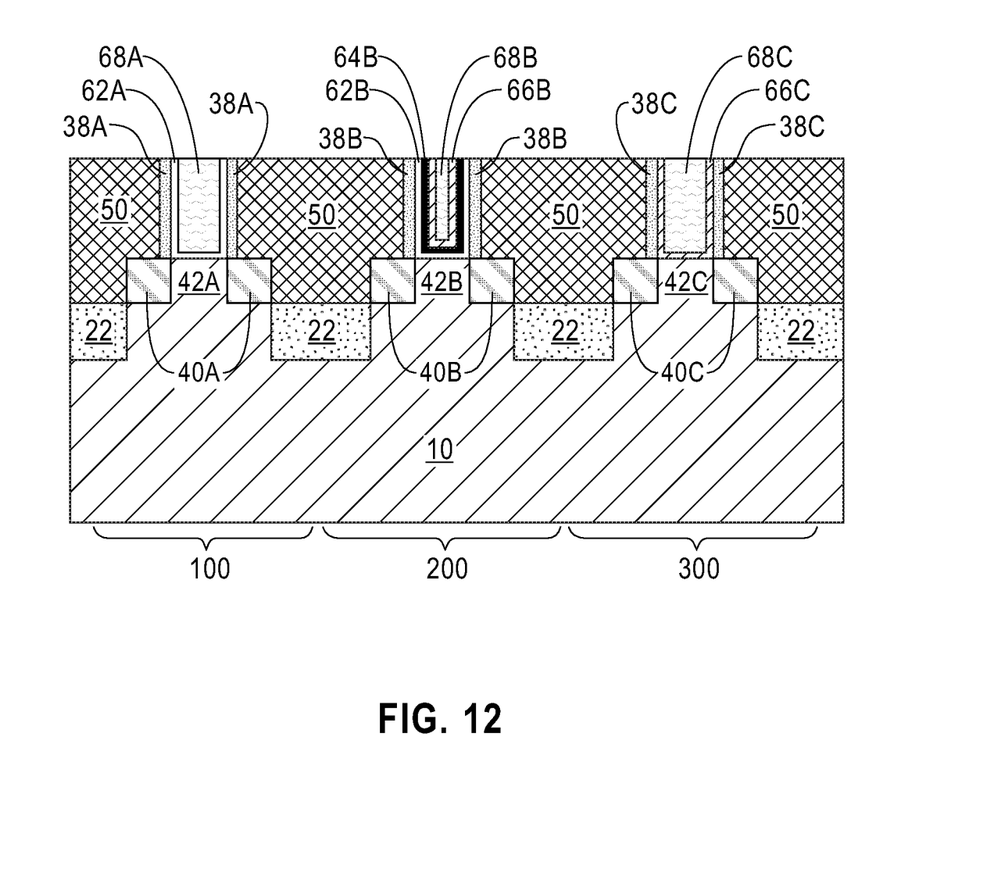
FIG. 12 is a cross-sectional view of the exemplary semiconductor structure of FIG. 11 after forming a first gate stack in the first gate cavity, a second gate stack in the second gate cavity and a third gate stack in the third gate cavity.

Referring to FIG. 12, portions of the conductive material layer 68L, the patterned second high-k dielectric layer 66, the capping material portion 64P and the patterned first high-k dielectric layer 62 that are located above the top surface of the ILD layer 50 are removed by employing a planarization process, such as, for example, CMP. The remaining portion of the patterned first high-k dielectric layer 62 within the first gate cavity 60A constitutes a first high-k gate dielectric 62A for pFETs thus formed in the first device region 100, and the remaining portion of the patterned first high-k dielectric layer 62 within the second gate cavity 60B constitutes a high-k tunneling gate dielectric 82B for NVM transistors thus formed in the second device region 200. The remaining portion of the capping material portion 64P within the second gate cavity 60B constitutes a floating gate electrode 64B for the NVM transistors. The remaining portion of the patterned second high-k dielectric layer 66 within the second gate cavity 60B constitutes a high-k control gate dielectric 66B for the NVM transistors, and the remaining portion of the patterned second high-k dielectric layer 66 within the third gate cavity 60C constitutes a second high-k gate dielectric 66C for nFETs thus formed in the third device region 300. The remaining portion of the conductive material layer 68L in the first gate cavity 60A constitutes a first gate electrode 68A for the pFETs, the remaining portion of the conductive material layer 68L in the second gate cavity 60B constitutes a control gate electrode 68B for the NVM transistors, and the remaining portion of the conductive material layer 68L in the third gate cavity 60C constitutes a second gate electrode 68C for the nFETs.

A first gate stack for pFETs is thus formed in the first device region 100. As shown, the first gate stack includes, from bottom to top, a first high-k gate dielectric 62A straddling the first channel region 42A of each first semiconductor fin 20A and a first gate electrode 68A. The first gate stack (62A, 68A) is laterally surrounded by the first gate spacer 38A.

A second gate stack for NVM transistors is thus formed in the second device region 200. As shown, the second gate stack includes, from bottom to top, a high-k tunneling gate dielectric 62B straddling the second channel region 42B of each second semiconductor fin 20B, a floating gate electrode 64B, a high-k control gate dielectric 66B and a control gate electrode 68B. The second stack (62B, 64B, 66B, 68B) is laterally surrounded by the second gate spacer 38B. In the present application, since the high-k tunneling gate dielectric 62B and the first high-k gate dielectric 62A in the first gate stack (62A, 68B) are formed from the first high-k dielectric layer 62L, the high-k tunneling gate dielectric 62B is composed of a high-k dielectric material as the first high-k gate dielectric 62A.

A third gate stack for nFETs is thus formed in the third device region 300. As shown, the second gate stack includes, from bottom to top, a second high-k gate dielectric 66C straddling the third channel region 42C of each third semiconductor fin 20A, and a third gate electrode 68C. The third gate stack (66C, 68C) is laterally surrounded by the third gate spacer 38C. In the present application, since the second high-k gate dielectric 66C and the high-k control gate dielectric 66B in the second gate stack (62B, 64B, 66B, 68B) are formed from the second high-k dielectric layer 66L, the second high-k gate dielectric 66C is composed of a same high-k dielectric material as the high-k control gate dielectric 66B.

The present application thus provides a feasible integration flow that allows integrating CMOS devices and NVM devices on the same substrate. By using a gate-last process flow, a tunneling gate dielectric for NVM transistors is formed at the same time as a gate dielectric for pFETs, and a control gate dielectric for the NVM transistors is formed at that same time as a gate dielectric for nFETs. The integration scheme of the present application is efficient because no additional processing steps are needed in formation of the gate stack for NVM transistors.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claim.

What is claimed is:

1. A method of forming a semiconductor structure comprising:
    providing a structure comprising a first gate cavity exposing a channel region of a first semiconductor material portion located in a first device region of a substrate, a second gate cavity exposing a channel region of a second semiconductor material portion located in a second device region of the substrate, and a third gate cavity exposing a channel region of a third semiconductor material portion located in a third device region of the substrate, wherein the first gate cavity, the second gate cavity and the third gate cavity are laterally surrounded by an interlevel dielectric (ILD) layer;
    forming a first high-k dielectric layer along sidewalls and bottom surfaces of the first, the second and the third gate cavities and on a top surface of the ILD layer;
    forming a capping material layer on the first high-k dielectric layer;
    patterning the capping material layer and the first high-k dielectric layer to remove a portion of each of the capping material layer and the first high-k dielectric layer from the third device region, wherein the patterning provides a patterned capping material layer and a patterned first high-k dielectric layer covering the first device region and the second device region, and a portion of the ILD layer and the third gate cavity in the third device region are exposed;
    forming a second high-k dielectric layer on the patterned capping material layer, the exposed portion of the ILD layer and along the sidewall and the bottom surface of the third gate cavity;
    patterning the second high-k dielectric layer and the patterned capping material layer to remove a portion of each of the second high-k dielectric layer and the patterned capping material layer from the first device region, wherein the patterning provides a patterned second high-k dielectric layer covering the second device region and the third device region and a capping material portion solely in the second device region, and a portion of the patterned first high-k dielectric layer in the first device region is exposed; and
    depositing a conductive material layer on the patterned first high-k dielectric layer and the patterned second high-k dielectric layer to completely fill the first, the second and the third gate cavities.

2. The method of claim 1, wherein the first device region is a p-type field effect transistor (pFET) region, the second device region is a non-volatile memory (NVM) transistor region, and the third device region is an n-type field effect transistor (nFET) region.

3. The method of claim 1, wherein the capping material layer comprises amorphous silicon or polysilicon.

4. The method of claim 1, further comprising annealing the first high-k dielectric layer after the forming the capping material layer.

5. The method of claim 1, wherein prior to the patterning the second high-k dielectric layer, the method further comprises:
    forming a sacrificial capping material layer on the second high-k dielectric layer;
    annealing the second high-k dielectric layer; and
    removing the sacrificial capping material layer.

6. The method of claim 5, wherein the sacrificial capping material layer comprises amorphous silicon or polysilicon.

7. The method of claim 1, further comprising removing portions of the conductive material layer, the patterned second high-k dielectric layer, the capping material portion and the patterned first high-k dielectric layer from the top surface of the ILD layer.

8. The method of claim 7, further comprising forming a first sacrificial gate stack over the channel region of the first semiconductor material portion, a second sacrificial gate stack over the channel region of the second semiconductor material portion and a third sacrificial gate stack over the channel region of the third semiconductor material portion.

9. The method of claim 8, further comprising forming a first gate spacer on sidewalls of the first sacrificial gate stack, a second gate spacer on sidewalls of the second sacrificial gate stack, and a third gate spacer on sidewalls of the third sacrificial gate stack, wherein the ILD layer laterally contacts the first gate spacer, the second gate spacer and the third gate spacer.

10. The method of claim 9, further comprising removing the first sacrificial gate stack, the second sacrificial gate stack and the third sacrificial gate stack to provide the first gate cavity, the second gate cavity and the third cavity, respectively.

11. The method of claim 8, further comprising forming first source/drain regions within portions of the first semiconductor material portion that do not underlie the first sacrificial gate stack, second source/drain regions within portions of the second semiconductor material portion that do not underlie the second sacrificial gate stack and third source/drain regions within portions of the third semiconductor material portion that do not underlie the third sacrificial gate stack.

12. The method of claim 1, further comprising forming a shallow trench isolation (STI) layer around a lower portion of each of the first semiconductor material portion, the second semiconductor material portion and third semiconductor material portion.

13. The method of claim 1, wherein the first semiconductor material portion, the second semiconductor material portion and the third semiconductor material portions are each semiconductor fins.

14. The method of claim 1, wherein each of the semiconductor fins is formed by patterning an upper semiconductor material of a substrate.

15. The method of claim 12, wherein the STI layer has a height that is less than a height of each of the first semiconductor material portion, the second semiconductor material portion and the third semiconductor material portion.

16. The method of claim 1, wherein the patterned first high-k dielectric layer and the patterned second high-k dielectric layer have topmost surfaces that are coplanar with each other as well as being coplanar with a topmost surface of the ILD layer.

17. The method of claim 1, wherein the first high-k dielectric layer is composed of a same high-k dielectric material as the second high-k dielectric layer.

18. The method of claim 1, wherein the first high-k dielectric layer is composed of a different high-k dielectric material than the second high-k dielectric layer.

* * * * *